United States Patent [19]

Mizukami

[11] Patent Number: 4,883,989
[45] Date of Patent: Nov. 28, 1989

[54] CIRCUIT FOR PRECHARGING A BUS

[75] Inventor: Toshiaki Mizukami, Nara, Japan

[73] Assignee: Sharp Kabushiki Kaisha, Osaka, Japan

[21] Appl. No.: 237,872

[22] Filed: Aug. 29, 1988

[30] Foreign Application Priority Data

Sep. 30, 1987 [JP] Japan .................................. 62-247666

[51] Int. Cl.⁴ .......................................... H03K 19/017
[52] U.S. Cl. .................................... 307/448; 307/443;
307/452; 307/475; 307/481; 307/242
[58] Field of Search ................ 307/443, 448, 451–453,
307/475, 481, 242–243, 530; 365/203

[56] References Cited

U.S. PATENT DOCUMENTS

| | | | |
|---|---|---|---|
| 4,154,978 | 5/1979 | Tu .................................... | 307/242 X |
| 4,419,592 | 12/1983 | Norgren et al. ................. | 307/242 X |
| 4,486,753 | 12/1984 | Saeki et al. ...................... | 307/242 X |
| 4,621,202 | 11/1986 | Pumo .............................. | 307/242 X |
| 4,624,006 | 11/1986 | Rampten et al. ................ | 307/242 X |
| 4,713,557 | 12/1987 | Carter ............................. | 307/475 X |
| 4,740,714 | 4/1988 | Masaki et al. ................... | 307/451 X |
| 4,763,023 | 8/1988 | Spence ............................ | 307/481 X |
| 4,766,334 | 8/1988 | Warner ............................ | 307/443 X |
| 4,819,208 | 4/1989 | Nakabayashi et al. ......... | 307/242 X |

FOREIGN PATENT DOCUMENTS 0192875 9/1986 European Pat. Off. ............ 307/242

*Primary Examiner*—David R. Hudspeth
*Attorney, Agent, or Firm*—Flehr, Hohbach, Test, Albritton & Herbert

[57] ABSTRACT

A circuit for precharging a bus has a first bus and a second bus separately and first and second driving MOS transistors respectively driving the first and second buses, and is so structured that a signal inputted to the first bus is transmitted to the gate of the second driving MOS transistor through a CMOS inverter to thereby drive the second bus and that a signal inputted to the second bus is transmitted to the gate of the first driving MOS transistor through another CMOS inverter to thereby drive the first bus. In this manner, a signal inputted to either of these buses causes these buses to be combined nonsynchronously.

2 Claims, 2 Drawing Sheets

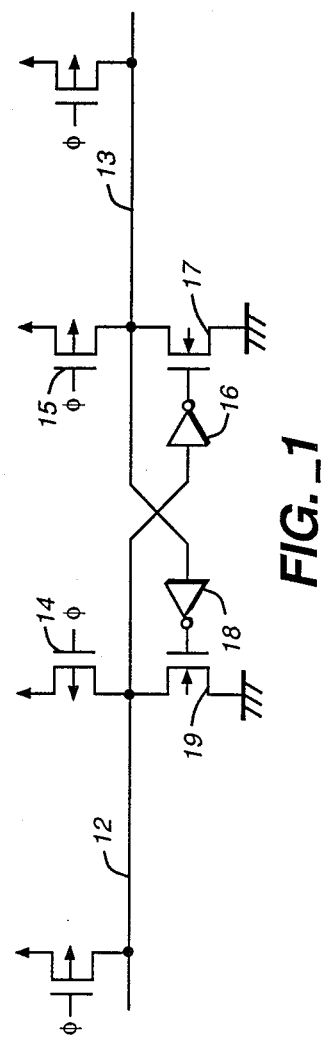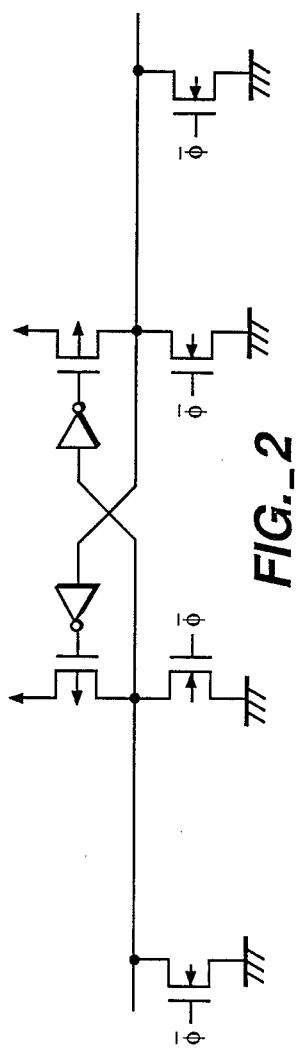

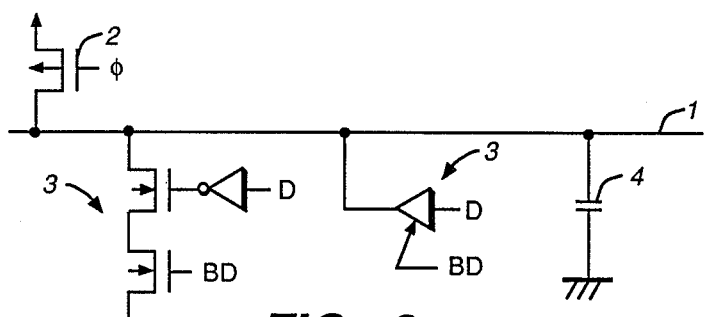
FIG._3
(PRIOR ART)
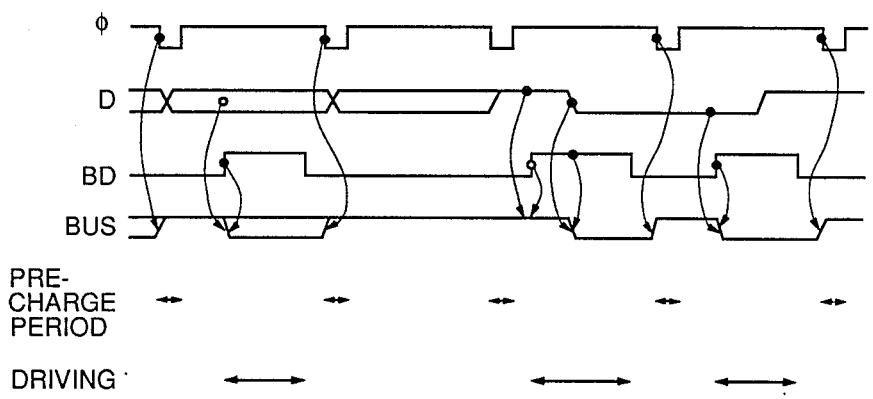
FIG._4
(PRIOR ART)
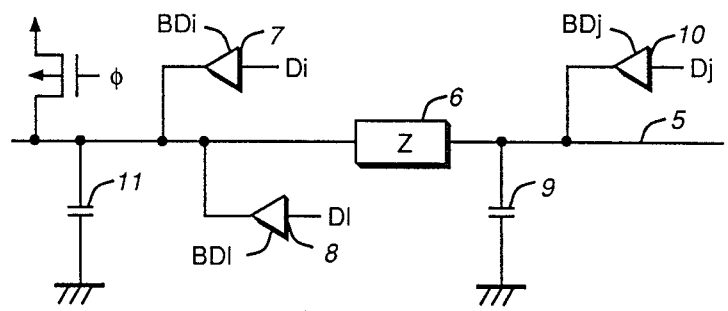
FIG._5
(PRIOR ART)

CIRCUIT FOR PRECHARGING A BUS

BACKGROUND OF THE INVENTION

This invention relates to a circuit with which a bus to be precharged inside a large scale integrated circuit can be divided and combined.

Large scale integrated circuits which are incorporated in microcomputers and the like are provided with buses for transferring data among their functional blocks such as the central processing unit, memory devices and I/O interface circuits. Such buses are frequently precharged to a high (H) level or a low (L) level. FIG. 3 shows an example of circuit for precharging a bus 1 to H level by a PMOS transistor 2 and FIG. 4 is a timing chart of the bus 1 of FIG. 3, showing that the bus 1 is charged to the H level in synchronism with clock signal $\phi$ applied to the gate of the PMOS transistor 2. After the bus 1 has been thus precharged to H level and when the bus driving signal BD applied to a bus driving circuit 3 is at H level, if a data signal D intended to be transmitted is at H level, the bus 1 remains in H level but if the data signal to be transmitted through the bus 1 is in L level, the bus driving circuit 3 operates to reduce the load capacitance of the bus 1. Speed of this operations depends on the driving power of this bus driving circuit 3.

If a bus is connected to many functional blocks of a large scale integrated circuit, for example, and is made very long, its load capacitance is also large. If its load capacitance becomes large and a more powerful bus driving circuit is required. Moreover, the driving force of the MOS transistor for precharging must also be increased in order to reduce the time for charging the bus to H level. In order to increase the driving power of the bus driving circuit or that of the MOS transistor for precharging, however, the bus driving circuit or the transistor must be made larger but it is not desirable from the point of view of large scale integration.

FIG. 5 shows another circuit structure characterized as having a resistive component 6 connected in series with a bus 5, bus driving circuit 7 and 8 to drive load capacitance 9 and another bus driving circuit 10 to drive load capacitance 11. In this case, the sum of the resistance of the bus driving circuits and that of the resistive component 6 controls the speed of the bus operation. Thus, for example, the resistance of the resistive component 6 cannot be compensated for by merely increasing the driving power as done in the case of FIG. 3. In other words, high-speed operation of the bus 5 is difficult to achieve.

SUMMARY OF THE INVENTION

It is therefore an object of the present invention to eliminate the aforementioned problems of prior circuits for precharging a bus.

The above and other objects of the present invention are achieved by providing a circuit having a first bus, a second bus, first and second precharging MOS transistors for precharging respectively the first and second buses, and first and second driving MOS transistors for driving respectively the first and second buses, and being so structured that a signal inputted to the first bus is transmitted to the gate of the second driving MOS transistor through a CMOS inverter to thereby drive the second bus and that a signal inputted to the second bus is transmitted to the gate of the first driving MOS transistor through another CMOS inverter to thereby drive the first bus. In this manner, a signal inputted to either of the buses serves to combine the first and second buses non-synchronously. With a circuit thus structured, a bus to be precharged is divided into two segments and its load capacitance is also divided such that high-speed operation of the bus can be achieved without increasing the driving power of the bus driving circuits or the MOS transistors for precharging them. As a result, the area occupied by these circuits and transistors need not be enlarged and this has a favorable effect in view of large scale integration.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a circuit diagram of a circuit embodying the present invention,

FIG. 2 is a circuit diagram of another circuit embodying the present invention,

FIG. 3 is a circuit diagram of a prior art circuit for the same purpose,

FIG. 4 is a timing chart for explaining the operation of the circuit shown in FIG. 3, and FIG. 5 is a circuit diagram of another prior art circuit.

DETAILED DESCRIPTION OF THE INVENTION

A circuit structured according to the present invention is shown in FIG. 1 but it is not intended to limit the scope of this invention.

The circuit shown in FIG. 1 is characterized as having a bus divided into a first bus 12 and a second bus 13 adapted to be precharged to H level respectively by P-channel MOS transistors 14 and 15 of which the sources are connected to a power source. The signal level of the first bus 12 is inputted to a CMOS inverter 16, the output therefrom being inputted to the gate of an N-channel MOS transistor 17 for driving the second bus 13. The source of this N-channel MOS transistor 17 is grounded and the drain of this N-channel MOS transistor 17 is connected to and drives the second bus 13. The level of the second bus 13 is inputted to another CMOS inverter 18 and the output from this CMOS inverter 18 is inputted to the gate of another N-channel MOS transistor 19 for driving the first bus 12. The source of this N-channel MOS transistor 19 is grounded and its drain is connected to and drives the first bus 12.

After the first and second buses 12 and 13 have been precharged to H levels respectively by the P-channel MOS transistors 14 and 15, if a signal in L level is desired to be transmitted and is applied to the first bus 12, this L level signal is inputted to the CMOS inverter 16 to have it inverted. The resultant H level signal is inputted to the gate of the N-channel MOS transistor 17. Since the source of this N-channel MOS transistor 17 is grounded, the N-channel MOS transistor 17 is switched on and the second bus 13 connected to its drain is dropped from the H level to the L level, thereby transmitting the originally intended L signal. An L signal can be similarly transferred from the second bus 13.

In summary, when it is desired to reduce to L level the bus system which is originally precharged to H level, the operation can be carried out speedily according to the present invention without requiring high driving power from a bus driving circuit such as a MOS transistor because the data transmission system is divided into the first bus 12 and the second bus 13 and so is the load capacitance of the data transmission system. The same statement applies when it is desired to charge the bus system from L level to H level.

If it is an H level signal that is inputted to the first bus 12 to be transmitted through this data transmission system when both the first and second buses 12 and 13 are precharged to H levels respectively by the P-channel MOS transistors 14 and 15, the inputted L level signal is received by the CMOS inverter 16 and outputted therefrom as an L level signal. As this L level signal is inputted to the gate of the N-channel MOS transistor 17, this N-channel MOS transistor 17 is not switched on and the second bus 13 remains in H level as when it was originally precharged. In other words, the H level signal is transmitted as desired.

In the case of a bus having a resistive component inserted in series therewith, if circuits shown in FIG. 1 are disposed on both ends of this resistive component such that the resistive component is separated from the bus, the equivalent drop in the driving power caused by this resistive component appears only in these circuits on both sides of the resistive component and hence there is no effect on the other circuits such as the bus driving circuits. Accordingly, the delay in the signal transmission due to the insertion of such a resistive component can be reduced to a minimum.

FIG. 2 shows another circuit structure embodying the present invention based on the same principle but characterized, in contrast to the above, as using N-channel MOS transistors for precharging the bus at low level and P-channel MOS transistors as driving circuits.

The foregoing description of preferred embodiments of the invention has been presented for purposes of illustration and description. It is not intended to be exhaustive or to limit the invention to the precise form disclosed and many modifications and variations are possible in light of the above teaching. For example, although combinations of N-channel and P-channel transistors were shown in the examples above, N-channel or P-channel transistors alone may be used as long as the same effects are obtainable. Such modifications and variations that may be apparent to a person skilled in the art are intended to be included within the scope of this invention.

What is claimed is:

1. A circuit for precharging a bus comprising
   a first bus,
   a second bus,
   a first precharging MOS transistor precharging said first bus,
   a second precharging MOS transistor precharging said second bus,
   a first CMOS inverter,
   a second CMOS inverter,
   a first driving MOS transistor for driving said first bus, and
   a second driving MOS transistor for driving said second bus,
   said circuit being so structured that a signal inputted to said first bus is transmitted to the gate of said second driving MOS transistor through said second CMOS inverter to thereby drive said second bus and that a signal inputted to said second bus is transmitted to the gate of said first driving MOS transistor through said first CMOS inverter to thereby drive said first bus whereby a signal inputted to either of said buses causes said first and second buses to be combined non-synchronously.

2. The circuit of claim 1 wherein said first and second driving MOS transistors are N-channel MOS transistors of which the sources are grounded and the drains are connected respectively to said first and second buses.

* * * * *